US007202695B2

(12) United States Patent
Chung et al.

(10) Patent No.: US 7,202,695 B2
(45) Date of Patent: Apr. 10, 2007

(54) APPARATUS AND METHOD FOR INSPECTING A LIQUID CRYSTAL DISPLAY PANEL

(75) Inventors: Han Rok Chung, Daegu (KR); Sung Nam Byun, Changwon-si (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/106,651

(22) Filed: Apr. 15, 2005

(65) Prior Publication Data

US 2005/0231229 A1 Oct. 20, 2005

(30) Foreign Application Priority Data

Apr. 19, 2004 (KR) ...................... 10-2004-0026735

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS

| | | | | |
|---|---|---|---|---|
| 6,538,709 | B1 * | 3/2003 | Kurihara et al. | 349/58 |
| 6,609,807 | B2 * | 8/2003 | Torihara et al. | 362/613 |
| 6,871,973 | B2 * | 3/2005 | Ju | 362/26 |
| 6,924,860 | B2 * | 8/2005 | Ohe et al. | 349/124 |
| 6,979,114 | B2 * | 12/2005 | Kao | 349/58 |
| 2001/0052957 | A1 * | 12/2001 | Ohe et al. | 349/124 |
| 2002/0015116 | A1 * | 2/2002 | Park | 349/9 |
| 2002/0018341 | A1 * | 2/2002 | Torihara et al. | 362/31 |
| 2004/0109105 | A1 * | 6/2004 | Nagakubo et al. | 349/65 |
| 2004/0246400 | A1 * | 12/2004 | Yeom | 349/58 |
| 2005/0052381 | A1 * | 3/2005 | Lee | 345/87 |
| 2005/0162582 | A1 * | 7/2005 | Kitada et al. | 349/58 |
| 2005/0174526 | A1 * | 8/2005 | Yu | 349/187 |

FOREIGN PATENT DOCUMENTS

| | | |
|---|---|---|
| JP | 11-183861 | 7/1999 |
| JP | 2000-056285 | 2/2000 |
| JP | 2005222058 A * | 8/2005 |
| TW | 573181 | 12/1991 |

OTHER PUBLICATIONS

Office action issued from the Taiwan Patent Office on Mar. 7, 2006.

* cited by examiner

*Primary Examiner*—Jermele Hollington
(74) *Attorney, Agent, or Firm*—McKenna Long & Aldridge LLP

(57) ABSTRACT

An apparatus and method for inspecting a liquid crystal display device is provided. The apparatus includes: a camera photographing a front surface of a liquid crystal panel; a back light irradiating light to the liquid crystal panel; a diffuser sheet diffusing the light generated from the back light; a prism sheet converting the diffused light so as to be perpendicularly incident to a rear surface of the liquid crystal panel; a probe unit applying an inspection signal to the liquid crystal panel; and a frequency converter converting a frequency of the light generated from the back light. The apparatus for inspecting the liquid crystal display device according to the invention detects bad sub-pixels, impossible to detect with the naked-eye, improving the quality of the liquid crystal display device.

11 Claims, 9 Drawing Sheets

APPARATUS AND METHOD FOR INSPECTING A LIQUID CRYSTAL DISPLAY PANEL

This application claims the benefit of Korean Patent Application No. P2004-26735, filed on Apr. 19, 2004, which is hereby incorporated by reference for all purposes as if fully set forth herein.

BACKGROUND OF THE INVENTION

1. Field of the Invention

The present invention relates to an apparatus and method for inspecting a liquid crystal display panel, and more particularly to an apparatus and method that improves the reliability of the inspection process.

2. Description of the Related Art

A liquid crystal display (LCD) device displays a picture in response to image signals by controlling the amount of light transmitted through the device. Because of the characteristics of the LCD device, such as light weight, thin body, and low power consumption, the application of LCD devices continues to increase. LCD devices are commonly used in office automation equipment, notebook computers, and the like.

Continued advances in LCD technology in the areas of screen size, high definition and low power consumption have lead to the rapid replacement of cathode ray tubes with LCD panels. As a result of research and development and mass production technology, active matrix LCD devices that provide excellent picture quality and low power consumption are being developed with larger display size and higher resolution.

Manufacturing methods for active matrix liquid crystal display devices include a substrate cleaning process, a substrate patterning process, an alignment forming/rubbing process, a substrate bonding/liquid crystal injection process, an inspection process, a repair process, and a mounting process.

The substrate cleaning process removes impurities which may contaminate the substrate surface of the liquid crystal display device. The substrate patterning process generally includes an upper substrate patterning process and a lower substrate patterning process. For example, during the upper substrate patterning process a common electrode and a black matrix are formed. During the lower substrate patterning process, for example, signal lines such as data and gate lines and the like are formed. Furthermore, a thin film transistor (TFT) is formed at a intersection of the data line and the gate line, and a pixel electrode is formed at a pixel region defined between the data line and the gate line, wherein the data line is connected to a source electrode of the TFT.

During the alignment film forming/rubbing process an alignment film is coated onto the upper and lower substrate and the alignment direction of the alignment film is formed, for example, by rubbing the alignment film with a rubbing cloth.

During the substrate bonding/liquid crystal injection process the upper substrate and the lower substrate are sealed together and a liquid crystal material and spacers are injected between the substrates through an injection hole forming a liquid crystal panel.

The inspection process includes an electrical inspection that is conducted after the signal lines and pixel electrode are formed on the substrate, and an electrical and naked-eye inspection that is conducted after the substrate bonding/liquid crystal injection process is completed.

During the repair process a determination is made as to whether the substrates that failed the inspection process are repairable.

During the mounting process a tape carrier package TCP comprising integrated circuits such as a gate drive IC and a data drive IC mounted thereon is connected to the liquid crystal panel. The integrated circuits may also be directly mounted on the substrate using a chip-on-glass(COG) technique or a tape automated bonding(TAB) technique using the TCP.

FIG. 1 illustrates an auto probe inspecting device 60 used during the inspection process. As illustrated in FIG. 1, the auto probe inspecting device 60 comprises a probe unit 10 and a back light unit BU.

The probe unit 10 provides signals from a generator and a controller (not shown) for driving the liquid crystal panel during the inspection process. The probe unit 10 includes: a probe base 14 having a hole in which the liquid crystal panel to be inspected is inserted; a printed circuit board(PCB) base 18 installed at adjacent edges of the probe base 14; a plurality of TCP blocks 16 connected to the PCB base 18; and a plurality of probe blocks 12 connected to the TCP blocks 16. In addition, each probe block 12 has a manipulator 24 that reduces the collision and friction forces generated upon installing the liquid crystal panel 2 in the probe unit 10.

The back light unit BU includes: back lights 20 that irradiate light on a rear surface of the liquid crystal panel 2; and a back light housing 22 on which the back lights 20 are secured.

A method of inspecting the liquid crystal panel 2 using the auto probe inspection device 60 according to the related art is as follows. First, the liquid crystal panel 2 is inserted into the hole of probe unit 10 such that the manipulators 24 engage the edge and corner of the liquid crystal panel 2 and contact is made between the pads 26 of the liquid crystal panel 2 and probe blocks 12. The back lights 20 receive power from a power source (not shown) and generate light that is transmitted to the liquid crystal panel 2. Thereafter, inspection signals generated from a signal driver and controller (not shown) are switched to each TCP block 16 through the PCB base 18. The inspection signals are transmitted through the TCP block 16 to pads 26 of the liquid crystal panel 2 via the probe block 12 and are then supplied to the signal lines connected to the pads 26. A worker checks for bad pixels generated on the liquid crystal panel, as well as, inspects the pixel driving of the liquid crystal panel in accordance with a signal control of the signal driver using the naked-eye.

Accordingly, in the related art inspection method determination of a bad pixel is based on the vision of the work. This results in errors during the inspection process depending upon the health and eye condition of the worker performing the inspection. Furthermore, the eyes are susceptible to fatigue when exposed to light rays. Thus the light generated from the back light 20 increases visual fatigue in the worker. Accordingly, there is a problem in that the reliability of the inspection result is decreases because result is not uniform.

Further, since the back light 20 employs a line light emission not a surface light emission, the light generated from the back light 20 is not uniformly incident to the entire surface of the liquid crystal panel 2. Accordingly, illumination at the center of the liquid crystal panel is different from the illumination at the edge of the liquid crystal panel. As a result, the liquid crystal panel is not uniformly illuminated.

SUMMARY OF THE INVENTION

Accordingly, the present invention is directed to an apparatus and method for inspecting a liquid crystal display panel that substantially obviates one or more of the problems due to limitations and disadvantages of the related art.

An advantage of the present invention is that it increases the reliability of the inspection process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for inspecting a liquid crystal display panel comprises a probe unit applying an inspection signal to the liquid crystal panel, a light source irradiating light to the liquid crystal panel, an optical sheet, stacked between the light source and the liquid crystal panel, and an optical system receiving the inspection signal and data from the liquid crystal panel.

In another aspect of the present invention, a method is provided for inspecting liquid crystal comprising uniformly irradiating the liquid crystal panel, supplying the liquid crystal panel with driving signals, scanning the liquid crystal panel with an optical device, processing the scanning data to determine defects in the liquid crystal panel, and displaying the detected defects.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to an embodiment of the present invention, example of which is illustrated in the accompanying drawings.

Figure 1:
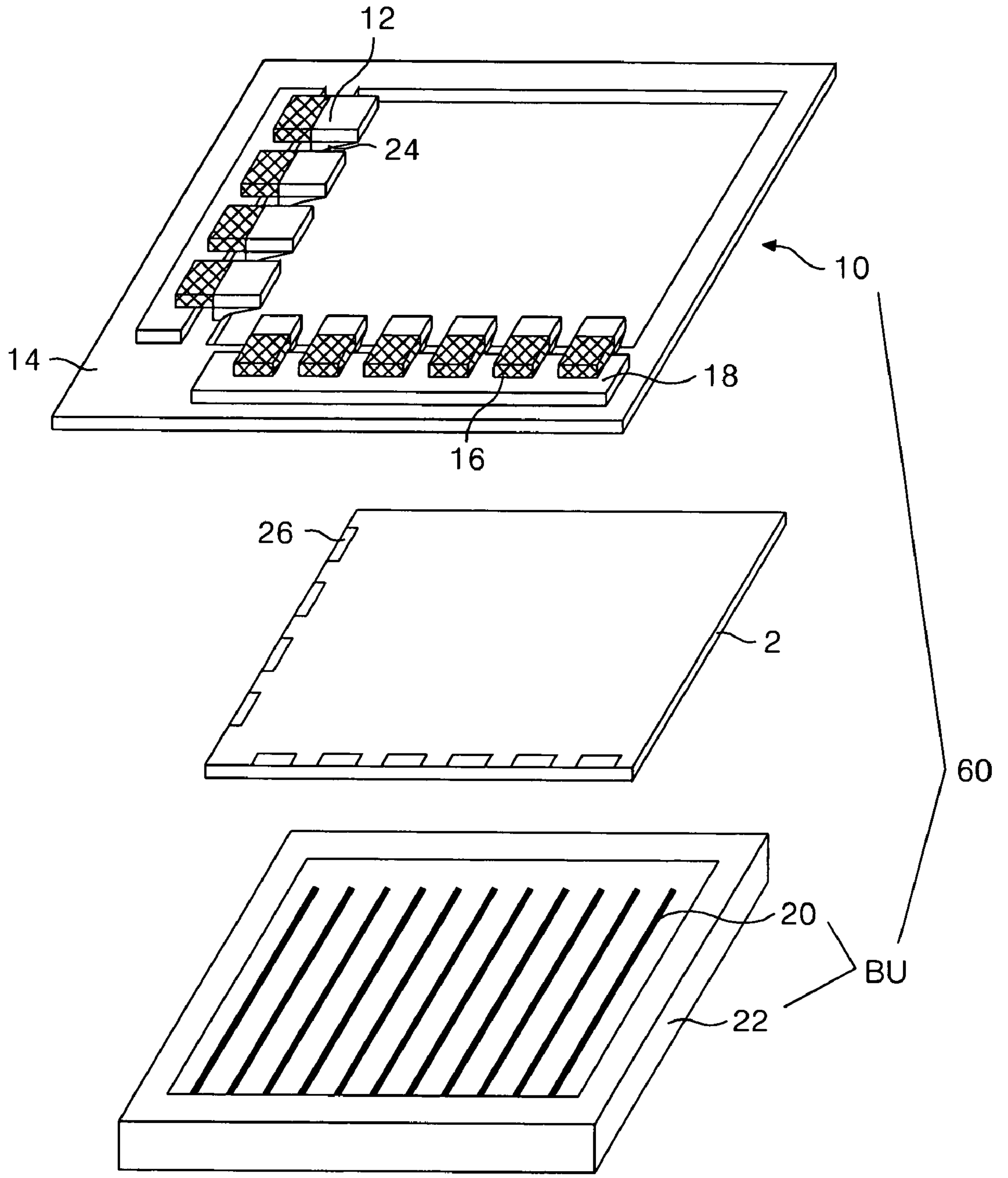
FIG.1 RELATED ART
FIG. 1 is a perspective view illustrating a related art apparatus for inspecting a liquid crystal display panel.
Figure 2:
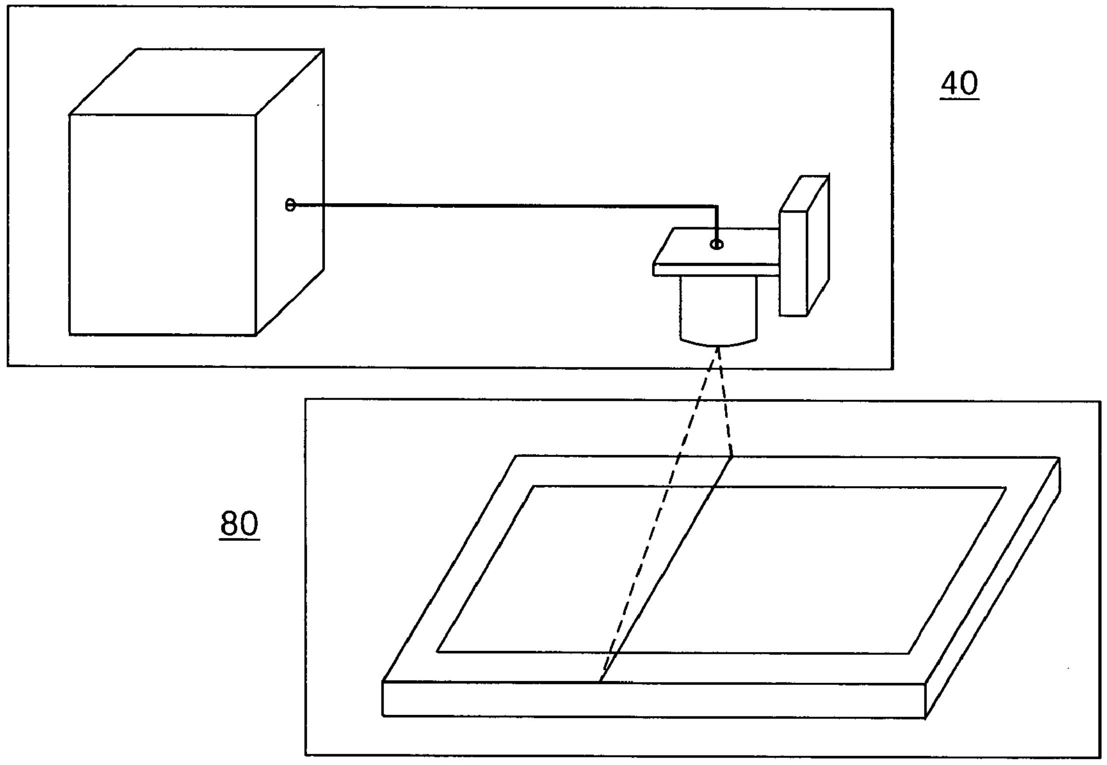
FIG. 2 is a schematic view illustrating an apparatus for inspecting a liquid crystal display panel according to a first embodiment of the present invention.

FIG. 2 is a schematic view illustrating an apparatus for inspecting a liquid crystal display panel according to a first embodiment of the invention. As illustrated in FIG. 2, the apparatus includes: an optical data processor 40 that obtains and processes data from a liquid crystal panel to be inspected; and an auto probe inspector 80 that holds the panel to be inspected and supplies driving signals to the panel during the inspection process.

Figure 3:
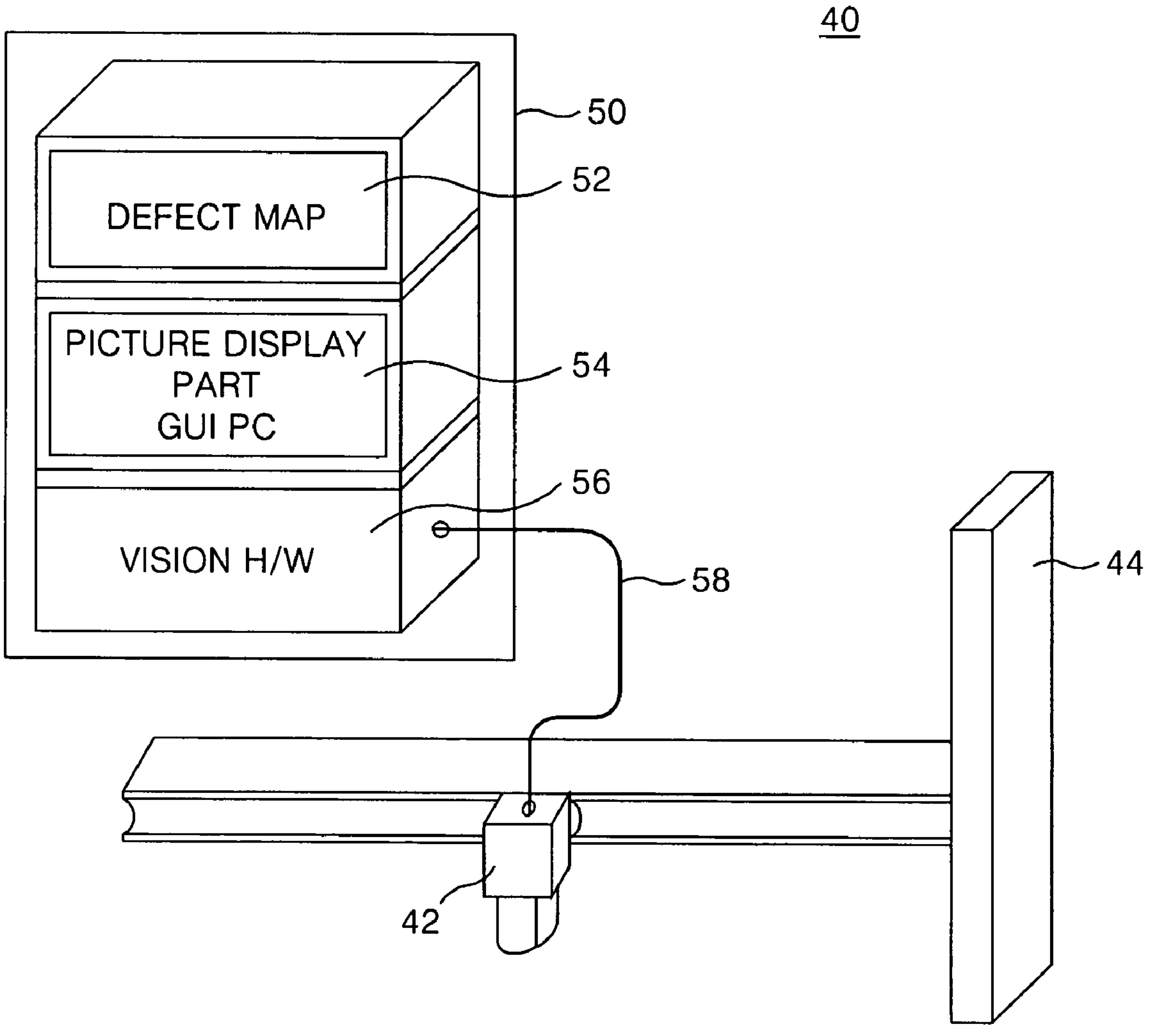
FIG. 3 is a detailed view illustrating a camera shown in FIG. 2.

As illustrated in FIG. 3, the optical data processor 40 includes: a camera 42, for example, a charge coupled device(CCD) camera; control means 44 for moving the camera 42 in a horizontal and/or a vertical direction; and data processing means 50 for processing data captured from the camera 42.

The camera 42 may operate in a line camera mode, wherein the camera scans the liquid crystal panel line by line, and/or in an area camera mode, wherein the camera scans predefined areas of the liquid crystal panel. The rate at which the camera 42 captures data is about 1000 frames per second.

Control means 44 moves camera 42 in a vertical direction in order to control the focal point from the panel and moves the camera 42 in a vertical direction in order to scan the panel.

Data processing means 50 includes vision hardware 56 that processes data transmitted from the camera 42, picture display 54 that displays the picture processed through vision hardware 56, and defect map 52 that identifies defects in the inspected liquid crystal panel 102.

Figure 4:
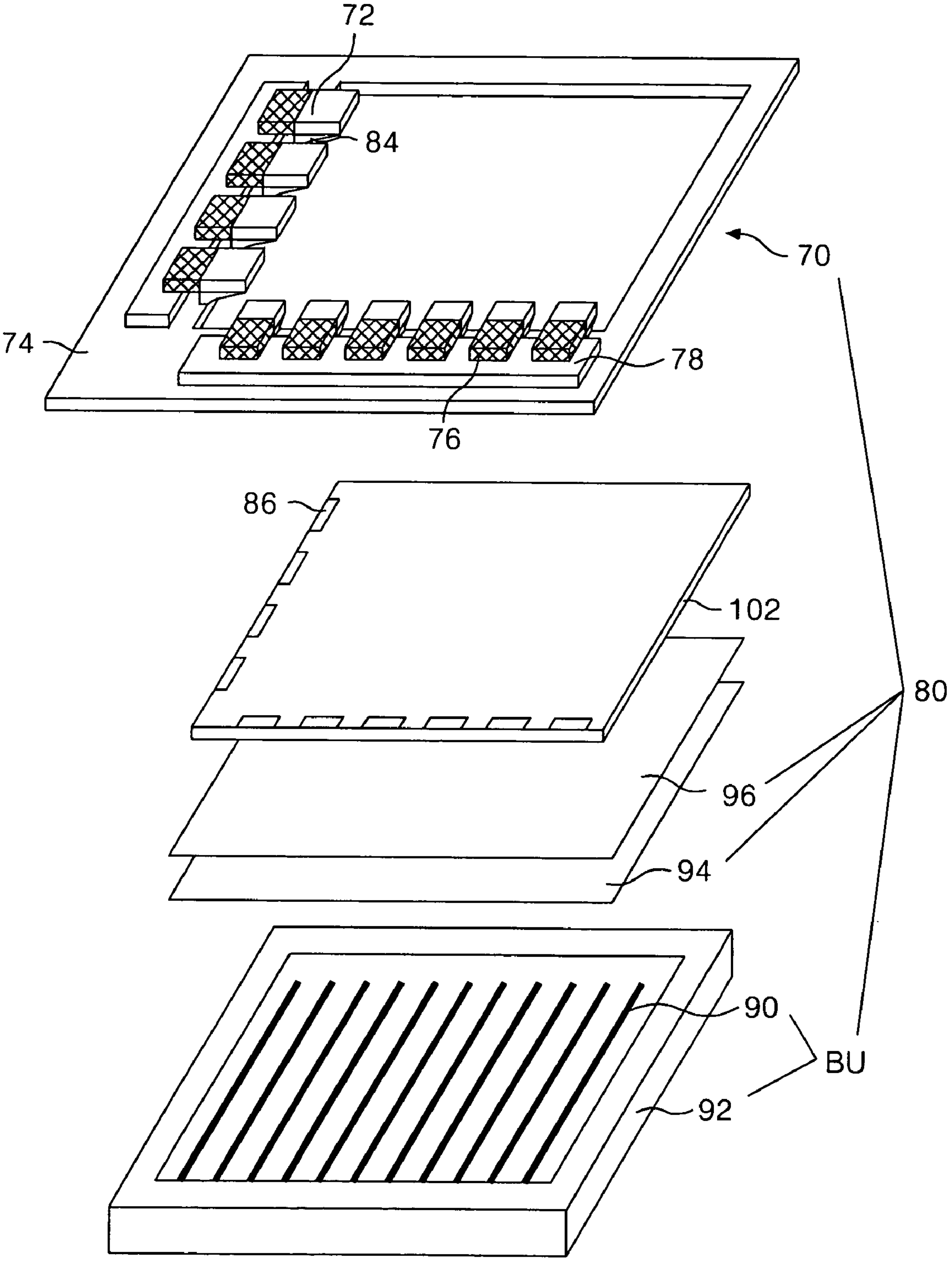
FIG. 4 is a detailed view illustrating an inspecting apparatus shown in FIG. 2.

As illustrated in FIG. 4, the auto probe inspector 80 includes a back light 90 that receives power from an exterior power source (not shown) to generate light; a back light housing 92 on which the back light 90 is secured, a diffuser sheet 94 stacked on the back light 90; a prism sheet 96 stacked on the diffuser sheet 94; a probe unit 70, and a driver (not shown) that generates the power and driving signals supplied to the probe unit 70.

The back light 90 irradiates a rear surface of the liquid crystal panel 102. The light generated from the back light 90 has, for example, a frequency in a range of about 30 Hz to about 60 Hz. The back light housing 92 to which back light 90 is secured, prevents leakage of the light generated from the back light 90, and improves the efficiency of the light.

Diffuser sheet 94 diffuses the light generated from the back light 90. Accordingly, the light passing through the diffuser sheet is uniformly incident to the entire surface of the prism sheet 96. The light incident to the prism sheet 96 passes through the prism sheet 96 and is converted such that it exits vertically from an upper surface of the prism sheet 96. As a result, the light exiting from the prism sheet 96 has uniform illumination.

The probe unit 80 includes: a probe base 74, having a hole in which the liquid crystal panel 102 may be inserted; a printed circuit board(PCB) base 78 installed on adjacent edges of the probe base 74; a plurality of TCP blocks 76 connected to the PCB base 78; and a plurality of probe blocks 72 connected to the TCP blocks 76. In addition, each probe block 72 has a manipulator 84 that reduces collision and friction forces generated upon inserting the liquid crystal panel 102 into the probe unit 70.

A driver (not shown) includes: a power driver supplying a power to the probe unit 70, which applies a signal to the liquid crystal panel 102; and a signal driver generating a signal for driving a pixel of the liquid crystal panel.

Figure 8:
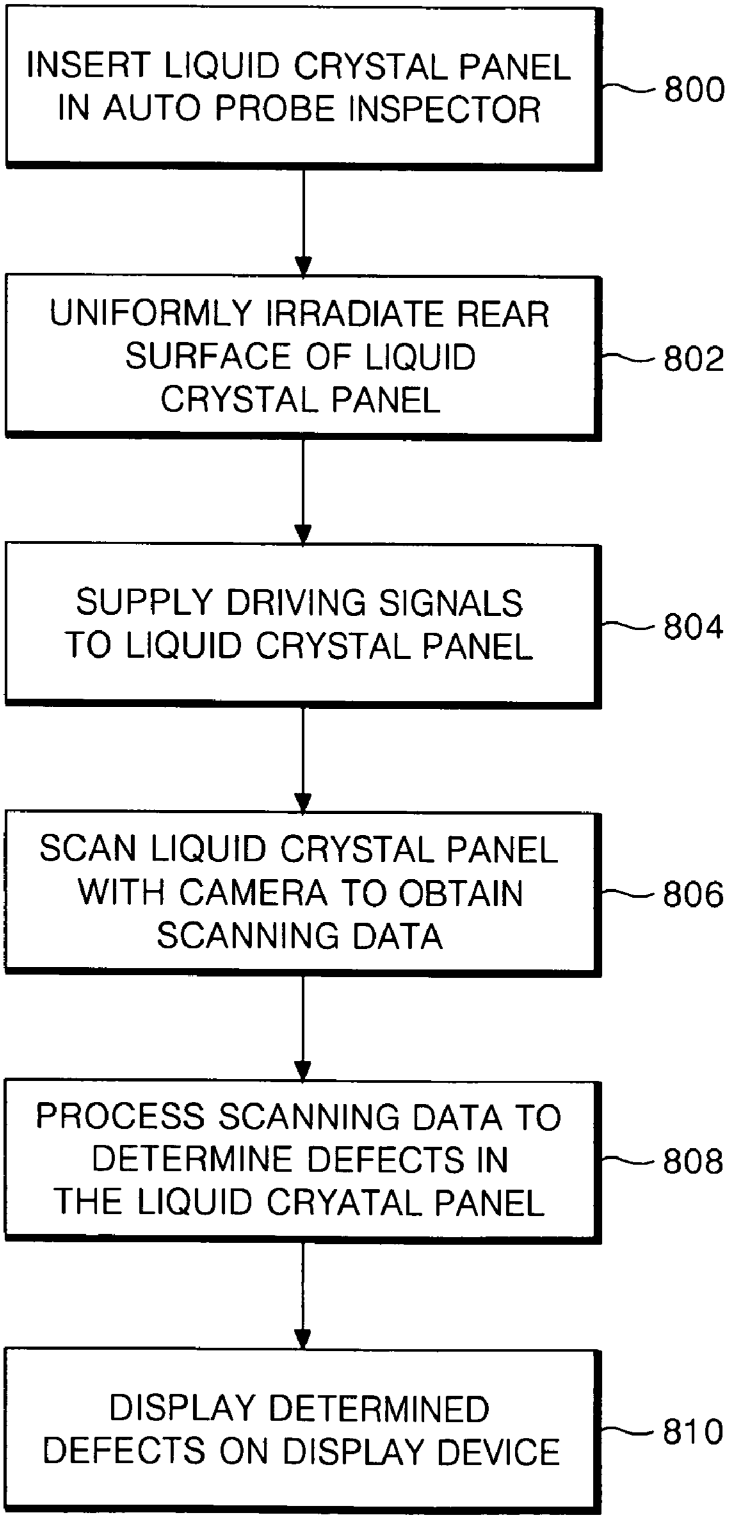
FIG. 8 is a flowchart illustrating a method of inspecting a liquid crystal display panel according to a first embodiment of the invention.

A method of inspecting a liquid crystal display panel according to a first embodiment of the invention is illustrated in FIG. 8. As illustrated in FIG. 8, the liquid crystal panel 102 is engaged with the probe unit 70 at step 800. Upon insertion, pads 86 formed at the edge of the liquid crystal panel 102 are engaged with the probe block 72. At step 802, the back light 90 uniformly irradiates a rear surface of the liquid crystal panel 102. More particularly, the light generated from the back light 90 passes through a diffuser sheet 94 and the diffused light then passes through a prism sheet 96 such that the light that exits the prism sheet is perpendicularly incident to a rear surface of the liquid crystal panel 102. Driving signals are then supplied, at step 804, to the panel through probe blocks 72. The camera 42 scans the liquid crystal panel 102 line by line and/or area by area, and transmits the scanning data to the data processor 50 via a cable 58 at step 806. The data processor 50 processes the scanning data received from the camera to detect defects in the panel. The defect map 52 then displays the detected defects on a display for worker confirmation.

Figure 5:
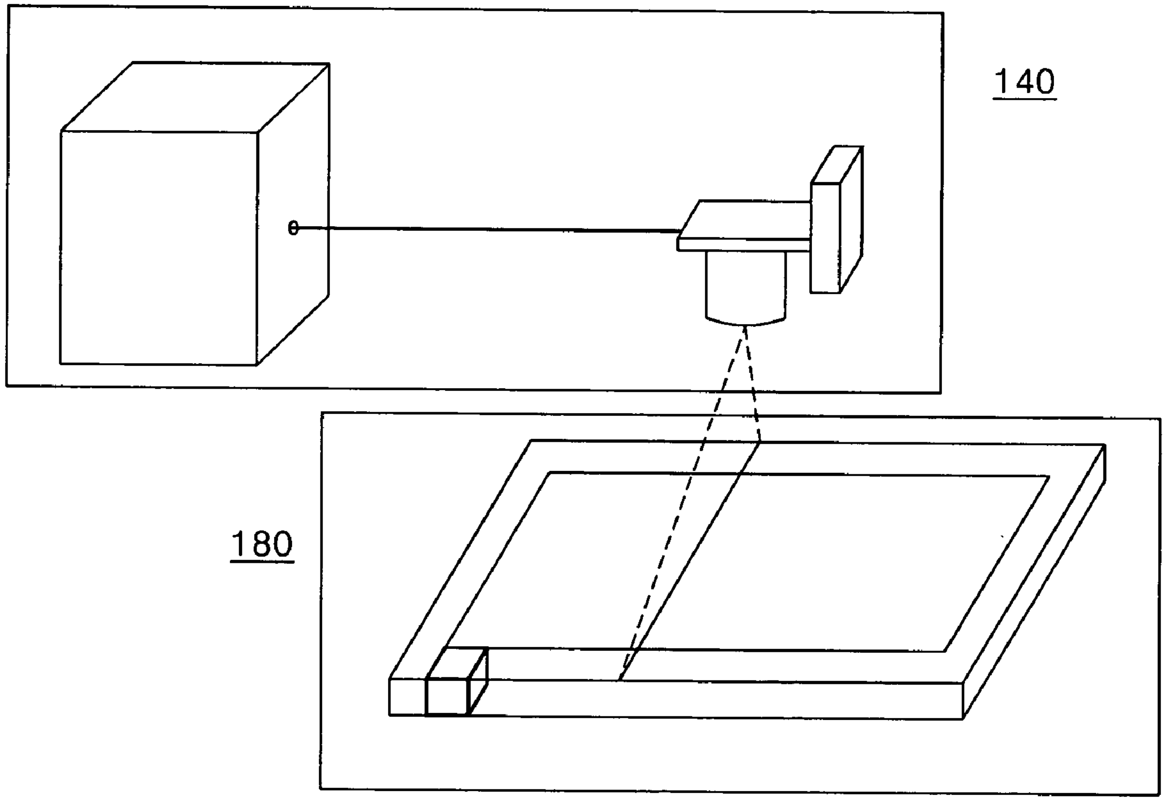
FIG. 5 is a schematic view illustrating an apparatus for inspecting a liquid crystal display panel according to a second embodiment of the present invention.
Figure 6:
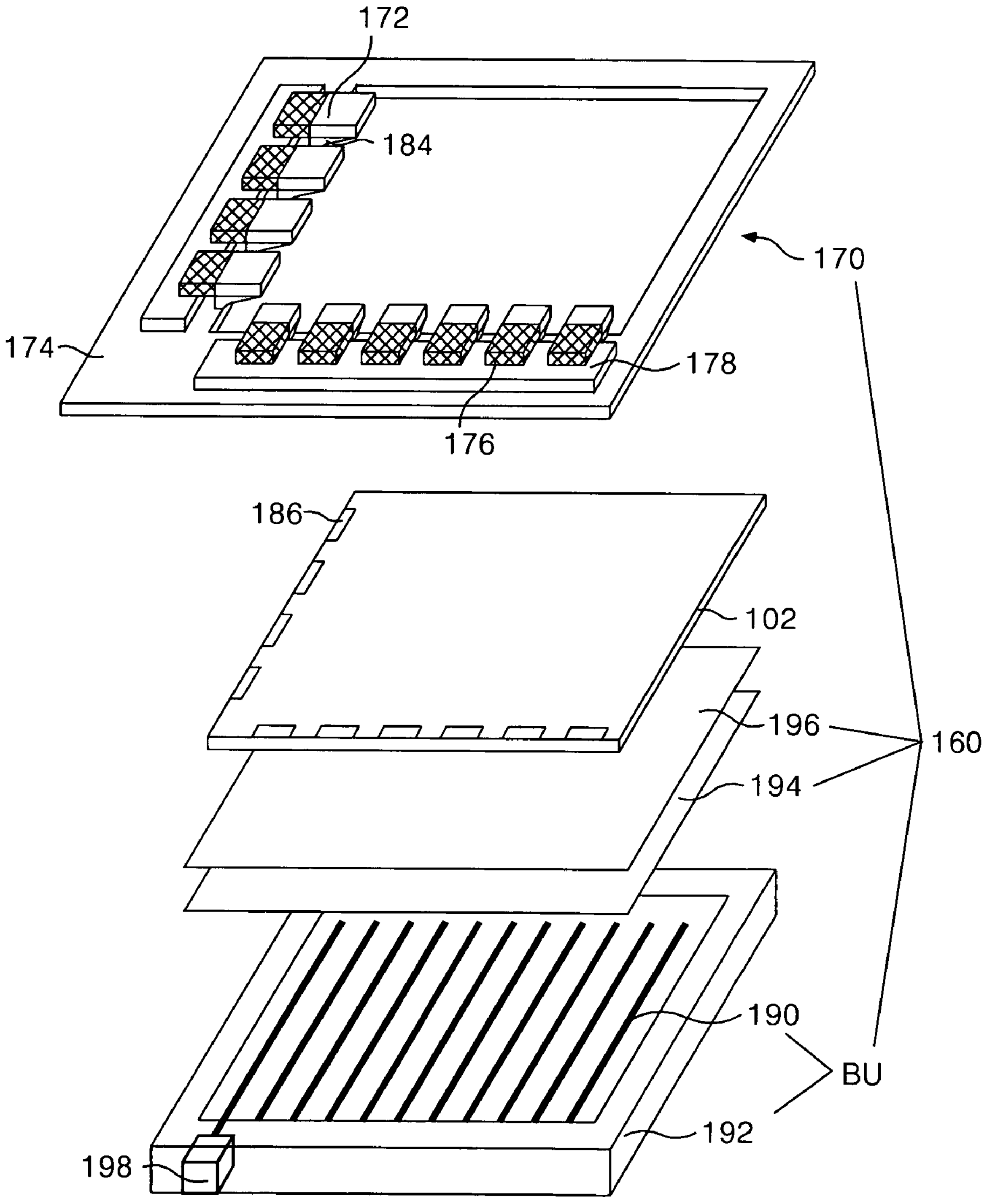
FIG. 6 is a detailed view illustrating an inspecting apparatus shown in FIG. 5.

FIG. 5 is a schematic view illustrating an apparatus for inspecting a liquid crystal display panel according to a second embodiment of the present invention. As illustrated in FIG. 5, the inspecting apparatus of the liquid crystal display device according to the second embodiment of the present invention has configuration elements identical to those of the inspecting apparatus shown in FIG. 2 except the addition of a frequency converter 198. Accordingly, a detailed description of the identical configuration elements is omitted.

Frequency converter 198 adjusts the frequency of the light generated from the back light 190. For example, the frequency the light generated from the back light 190 (which may be in the range of 30 Hz to 60 Hz) is adjusted to be substantially equal to the photographic frequency of the camera 42, for example, 1,000 Hz. Accordingly, it is possible to prevent flicker generated by the difference between the frequencies.

As compared to the inspecting apparatus according to the second embodiment, the inspecting apparatus according to the first embodiment of the invention, a flicker can be generated since there may be a difference between the frequency of the light generated by the back light and the rate at which the CCD obtains the scanning data.

Figure 9:
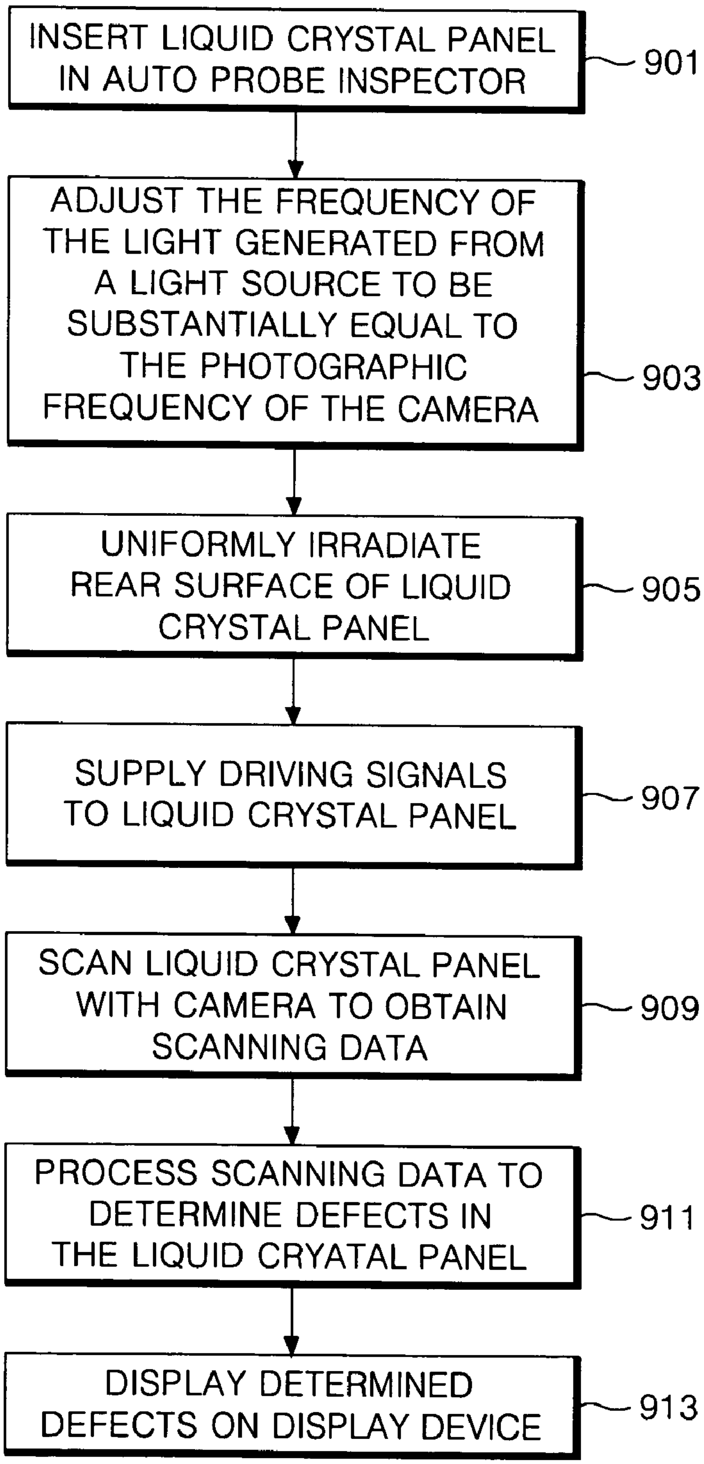
FIG. 9 is a flowchart illustrating a method of inspecting a liquid crystal display panel according to a second embodiment of the invention.

A method of inspecting a liquid crystal display panel according to a second embodiment of the invention is illustrated in FIG. 9. As illustrated in FIG. 9, the liquid crystal panel 102 is engaged with a probe unit 170 at step 901. Upon insertion of the liquid crystal panel, pads 186 formed at the edge of the liquid crystal panel 102 are engaged with probe blocks 172. Then, the liquid display panel is uniformly irradiated. More specifically, the frequency of the light generated from the back light 190 is adjusted to be substantially equal to the photographic frequency of the camera 42. Then at step 905, the adjust frequency light is passes through diffuser sheet 194, and the diffused light passes through prism sheet 196 such that the light that exits prism sheet is perpendicularly incident to a rear surface of the liquid crystal panel 102. At step 907, driving signals are supplied to the liquid crystal panel 102 through probe block 172. The camera 42 scans the liquid crystal panel 102 for line by line and/or area by area, and transmits the scanning data to data processor 50 via a cable 58 at step 909. The data processor processes the transmitted data to detect defects in the panel and the defect map displays the detected defects on a display for confirmation by a worker, at step 911.

Figure 7:
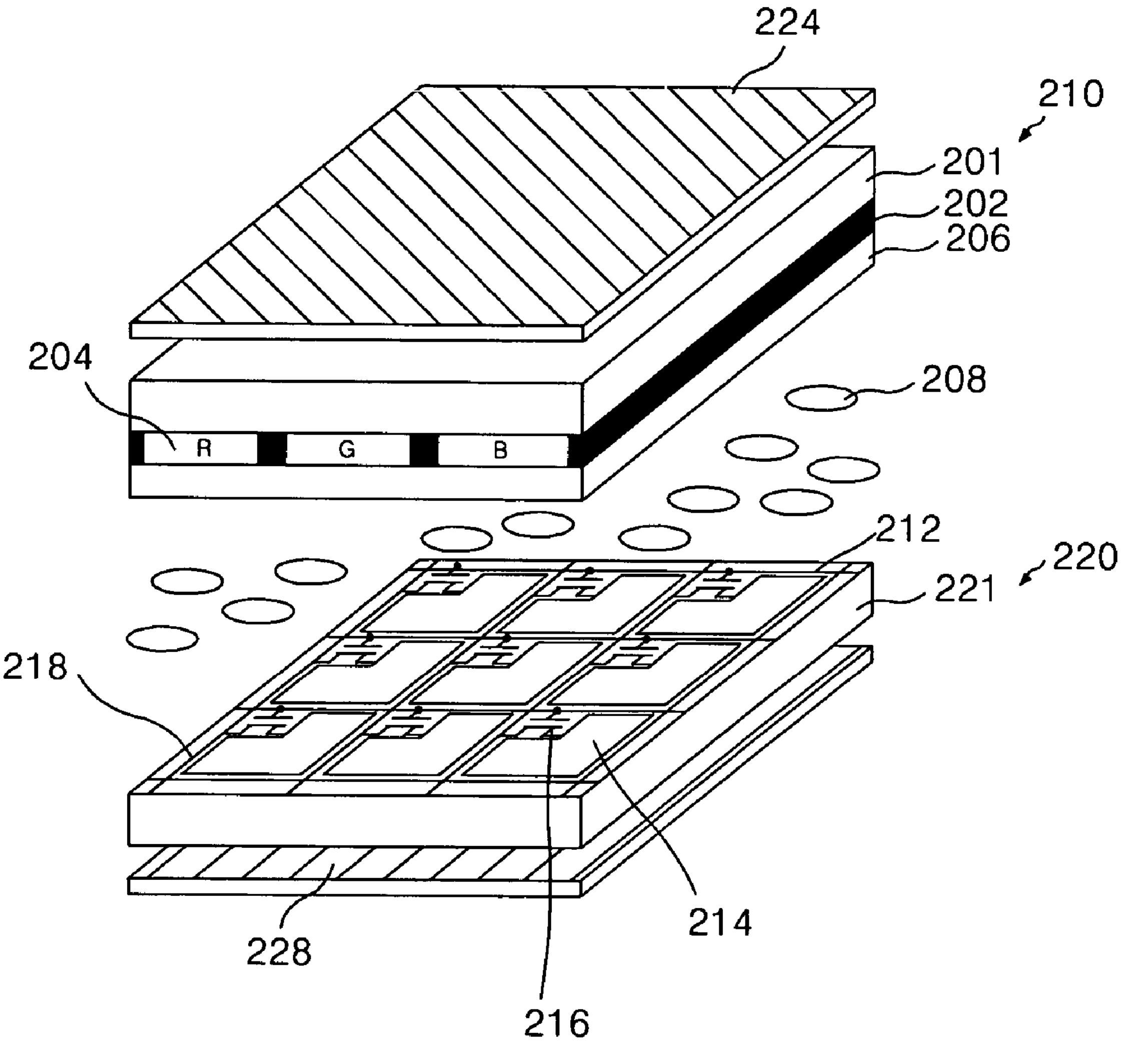
FIG. 7 is a detailed view illustrating a liquid crystal panel shown in FIGS. 2 and 5.

An exemplary structure of the liquid crystal panel is illustrated in FIG. 7. As illustrated in FIG. 7, the liquid crystal panel comprises an upper substrate 210, a lower substrate 220, a liquid crystal material injected between the upper and the lower substrates 210 and 220, a first polarizing plate 228 stacked on a rear surface of the lower substrate 220, and a second polarizing plate 224 stacked on a front of the upper substrate 210.

On the upper substrate 210, a color filter 204, a common electrode 206, and a black matrix are formed. On the lower substrate 220, signal lines such as a data line 218, a gate line 212 and the like are formed. Further, a thin film transistor (TFT) 216 is formed at a cross of the data line 218 and the gate line 212, and a pixel electrode 214 is formed at a pixel region defined between the data line 218 and the gate line 212. A liquid crystal material 208 is injected between the upper substrate 210 and the lower substrate 220 formed as set forth above.

The first polarizing plate 228 is stacked on the rear surface of the lower substrate 220 to polarize the light generated from the back light unit so as to be passed through the lower substrate 220.

The second polarizing plate 224 re-polarizes the polarized light passing through the liquid crystal material 208 so as to make a user can recognize the polarized light as a picture.

As described above, the inspecting apparatus of the liquid crystal display device according to the present invention uses an optical sheet, for example, a diffuser sheet and a prism sheet, to solve the problem of irregular illumination thus it is possible to uniformly irradiate the light from the back light to the entire surface of the liquid crystal panel. Furthermore, the inspecting apparatus of the liquid crystal display device according to the second embodiment of the present invention is capable of removing the flicker generated by a difference between the frequency of the light generated from the back light and the frequency of the camera, by adjusting the frequency of the light generated to be substantially equal to the photographic frequency of the camera.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An apparatus for inspecting a liquid crystal display device comprising:

a probe unit applying an inspection signal to a liquid crystal panel;

a light source irradiating light to the liquid crystal panel;

an optical sheet between the light source and the liquid crystal panel, diffusing the light generated from the light source and changing an exit angle of the diffused light;

an optical system receiving the inspection signal and data about picture implemented on the liquid crystal panel by irradiating the light; and frequency adjusting means for adjusting a frequency of the light generated from the light source.

2. The apparatus according to claim 1, wherein the optical sheet includes a diffuser sheet diffusing the light generated from the light and a prism sheet changing the exit angle of the light diffused from the diffuser sheet.

3. The apparatus according to claim 1, wherein the frequency adjusting means adjusts the frequency of the light generated from the light source to be substantially identical to a photographing frequency of the optical system.

4. The apparatus according to claim 1, wherein the optical system includes at least one of a line charge coupled device camera scanning the liquid crystal panel line by line to gain data and an area charge coupled device camera scanning the liquid crystal panel for area by area to gain data.

5. The apparatus according to claim 1, wherein the probe unit includes:

a probe base;

a printed circuit board(PCB) base installed at an edge of the probe base;

a tape carrier package block to which a driving circuit is connected;

a probe block, connected to the liquid crystal panel, supplying the driving inspection signal from the tape carrier package to the liquid crystal panel; and a manipulator for reducing collision and friction forces generated upon inserting the liquid crystal panel into the probe unit.

6. The apparatus according to claim 1, further comprising:

a data processor for processing data gained from the optical system; and a picture display device for displaying the processed data on a picture.

7. The apparatus according to claim 6, wherein the data processor displays detected defects in the liquid crystal panel on the picture display device.

8. A method for inspecting a liquid crystal display panel, comprising:

uniformly irradiating a rear surface of the liquid crystal display panel;

supplying the liquid crystal display panel with driving signals;

scanning the liquid crystal display panel with an optical device;

processing the scanning data obtained by the optical device to determine defects in the liquid crystal display panel; and displaying the detected defects on a display device, wherein uniformly irradiating the liquid crystal display panel comprises:

generating light from a light source;

passing the light through a diffuser sheet;

passing the diffused light through a prism sheet such that the light exiting the prism sheet is perpendicularly incident to the rear surface of the liquid crystal display panel; and adjusting a frequency of the light generated from the light source to be substantially equal to a photographic frequency of the optical device.

9. The method of claim 8, wherein the optical device is a charge coupled device camera.

10. The method of claim 8, wherein the optical device scans the liquid crystal display panel line by line.

11. The method of claim 8, wherein the optical device scans predetermined areas of the liquid crystal display panel.

* * * * *